United States Patent
Pereira et al.

[19]

[11] Patent Number: 5,937,021
[45] Date of Patent: Aug. 10, 1999

[54] DIGITAL PHASE-LOCKED LOOP FOR CLOCK RECOVERY

[75] Inventors: Nathalie Pereira, Eaubonne; Bertrand DeBray, Maisons Laffitte, both of France

[73] Assignee: Alcatel Telspace, Nanterre Cedex, France

[21] Appl. No.: 08/848,742

[22] Filed: May 1, 1997

[30] Foreign Application Priority Data

May 2, 1996 [FR] France .................................. 96-05496

[51] Int. Cl.$^6$ ....................................................... H03D 3/24
[52] U.S. Cl. ........................ 375/376; 375/373; 375/360; 375/327
[58] Field of Search ..................... 375/376, 373, 375/360, 363, 375, 327; 327/147, 156, 160, 165

[56] References Cited

U.S. PATENT DOCUMENTS

| | | | |
|---|---|---|---|
| 3,781,695 | 12/1973 | Jackson | 328/155 |
| 4,803,680 | 2/1989 | Rokugo et al. | 370/142 |
| 5,715,286 | 2/1998 | Itoh et al. | 375/376 |
| 5,754,606 | 5/1998 | Matsuyama et al. | 375/373 |
| 5,764,711 | 6/1998 | Jokura | 375/376 |
| 5,793,825 | 8/1998 | Humphreys et al. | 375/375 |
| 5,815,541 | 9/1998 | Fukushi | 375/376 |
| 5,825,253 | 10/1998 | Mathe et al. | 331/18 |

FOREIGN PATENT DOCUMENTS

| | | |
|---|---|---|
| 604997 | 8/1989 | Australia . |
| 2023656 | 12/1971 | Germany . |

OTHER PUBLICATIONS

Y. Rokygo et al, "A Digital Phase–Locked Loop for Stuffing Synchronization Systems", *Electronics & Communications in Japan–Part I—Communications*, vol. 75, No. 4, Apr. 1, 1992, pp. 1–12.

*Primary Examiner*—Stephen Chin
*Assistant Examiner*—Mohammad Ghayour
*Attorney, Agent, or Firm*—Sughrue, Mion, Zinn, Macpeak & Seas, PLLC

[57] ABSTRACT

The invention relates to a phase-locked loop delivering a recovered clock signal from a reference clock signal $F_{ref}$ in which some transitions are missing. The loop includes a first divide-by-M frequency divider receiving the clock $F_{ref}$ and delivering a signal of frequency $F_{ref}/M$; a phase comparator providing a phase error signal from the signal of frequency $F_{ref}/M$, and the output signal from a second divide-by-M frequency divider; a divide-by-K frequency divider providing a signal of frequency $F_k$ from a local oscillator signal of frequency $F_{oL}$ receiving the phase error signal as a control signal; an adder-counter of the division ratio p/q receiving the local oscillator signal of frequency $F_{oL}$ and delivering a signal of frequency $F_o$ equal to $F_{oL}*p/q$; a mixer delivering a signal of frequency $F_n$ equal to $F_o-F_k$ on the basis of signal of frequency $F_k$ and the signal of frequency $F_o$; and a divide-by-N frequency divider synchronized by $F_{oL}$, receiving the signal of frequency $F_n$, and delivering a recovered clock to the second divide-by-M frequency divider.

3 Claims, 1 Drawing Sheet

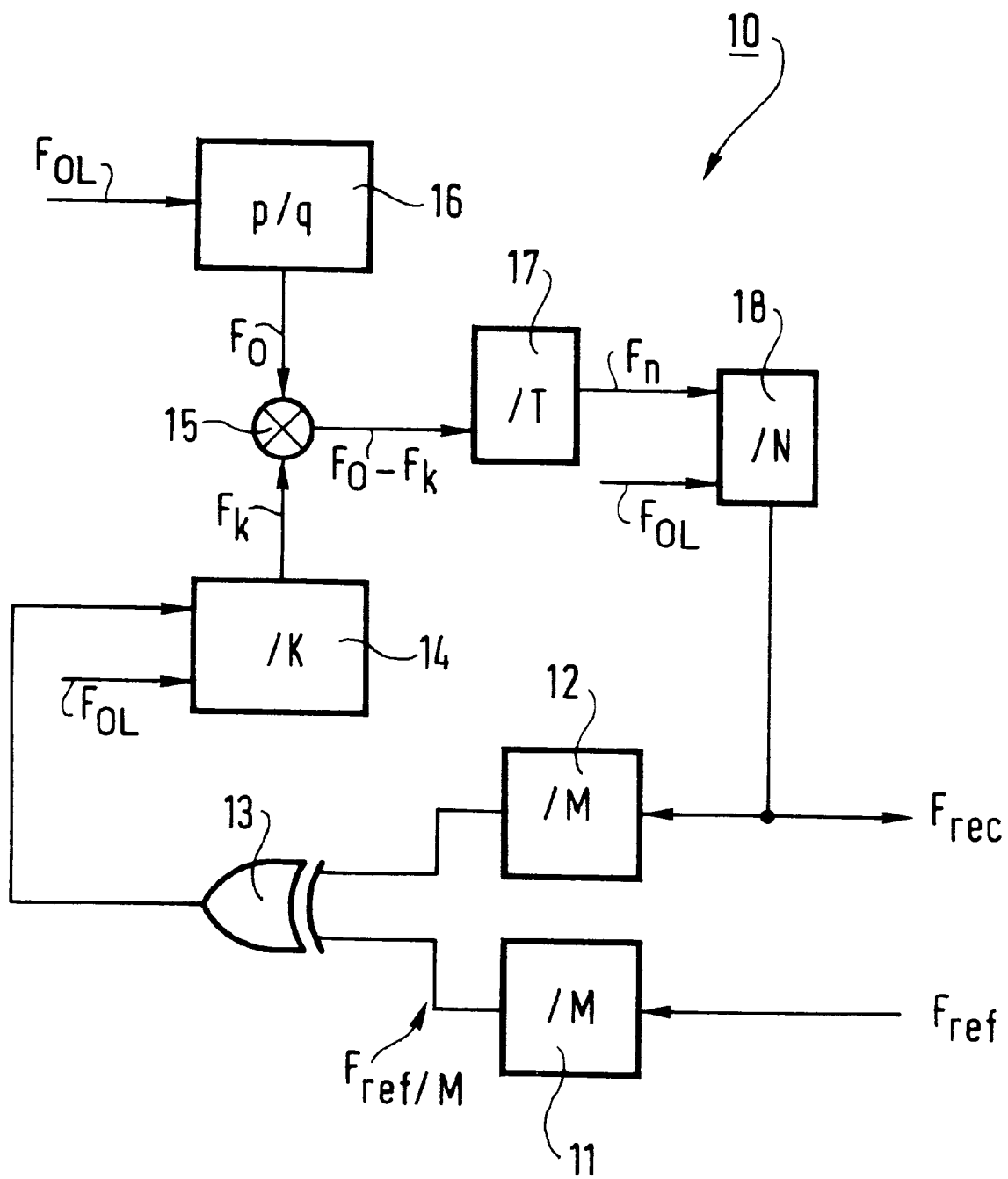

DIGITAL PHASE-LOCKED LOOP FOR CLOCK RECOVERY

BACKGROUND OF THE INVENTION

1. Field of the Invention

The field of the invention is that of circuits for generating clock signals, and it relates more particularly to a circuit designed to recover a clock rate from a reference clock in which there are missing transitions. The circuit of the invention is required, in particular, to be suitable for recovering clocks at different frequencies, i.e. it must present the ability to operate at multiple rates.

2. Description of the Related Art

Below in this description, the context is one of a transmission system, e.g. a microwave system, in which digital data is transmitted in quasi-synchronous frames. Each frame conveys a plurality of calls, and a receiver of the frames demultiplexes the received data in order to apply it to different paths, each corresponding to a different destination. Each path has a clock frequency corresponding thereto.

For the purpose of being written into a buffer memory, the data on each path, and the outlet from the demultiplexing system, are synchronized by means of a clock having "holes", i.e. in which some transitions are missing. These holes come from justification during multiplexing on transmission, from the absence of other paths, and from information bits being inserted into the frame (frame clock word, parity bits, error correcting code, etc.). In order to enable the received data to be read back properly, it is necessary to regenerate a clock that does not have any holes, i.e. in which the transitions are regular. For this purpose, it is common practice to use a phase-locked loop that is designed to deliver a regular clock, having the same frequency as the mean frequency of the clock having holes, and for use in reading the data that is stored temporarily in the buffer memory.

Three different transmission rates (1.544 Mbit/s, 2.048 Mbit/s, and 8.448 Mbit/s) are taken into consideration below, thus requiring three different clock frequencies to be recovered. The accuracies of the clocks to be recovered in the systems under consideration are: ±50 ppm for data rates of 1.544 Mbit/s and 2.048 Mbit/s, and of ±30 ppm for the data rate of 8.448 Mbit/s.

The invention proposes a solution that is digital rather than analog for performing the clock recovery function for reasons of modularity, of reusability (reprogrammable components), of integration, and of cost (suitable for implanting in application specific integrated circuits (ASICs)).

The present invention seeks in particular to satisfy the following CCITT recommendations: G823 (or G824 for US data rates) concerning maximum acceptable jitter at a hierarchical interface; G921 concerning residual jitter; G703 concerning clock accuracy and pulse specifications; G751 for multiplexing and/or demultiplexing at framed rates of 34.368 Mbit/s (i.e. 4*8.448 Mbit/s) with positive justification for jitter transfer; G742 for multiplexing and/or demultiplexing at the rate of 2.048 Mbit/s with positive justification for jitter transfer; and G743 for multiplexing and/or demultiplexing a tributary rate of 1.544 Mbit/s for jitter transfer.

European patent application No. 0 471 506 discloses a digital circuit suitable for regenerating a regular clock signal from a clock having holes. Nevertheless, that circuit operates only if the clock to be recovered is a clock that is synchronous with the transmitted signal and it assumes that the clock to be recovered is a rational function of the clock with holes. That circuit is therefore unsuitable for use with a quasi-synchronous transmission system where each of the various tributaries has its own clock.

SUMMARY OF THE INVENTION

A particular object of the present invention is to mitigate that drawback.

More precisely, an object of the present invention is to provide a circuit designed to deliver a regular clock, referred to as a "recovered clock" whose frequency is equal to the mean frequency of the clock having holes (the reference clock) in a quasi-synchronous system.

This object, and others that appear below, is achieved by a digital phase-locked loop of the type delivering a clock signal referred to as a "recovered clock" $F_{rec}$, from a reference clock signal in which some transitions are missing, referred to as a "clock with holes" and of frequency $F_{ref}$, comprising:

- a first divide-by-M frequency divider receiving said clock with holes $F_{ref}$ and delivering a signal of frequency $F_{ref}/M$;
- a two-input phase comparator, one of said inputs receiving said signal of frequency $F_{ref}/M$, and the other of said inputs receiving the output signal from a second divide-by-M frequency divider, said phase comparator delivering a phase error signal;
- a divide-by-K frequency divider for dividing a local oscillator signal of frequency $F_{oL}$, the divider receiving said phase error signal as its control signal and delivering a signal of frequency $F_k$;
- an adder-counter receiving said local oscillator signal of frequency $F_{oL}$ and delivering an output signal of frequency $F_o$ equal to $F_{oL}*p/q$ where p/q is the division ratio of said adder-counter;
- a mixer receiving said signal of frequency $F_k$ and said signal of frequency $F_o$, said mixer delivering a signal of frequency $F_n$ equal to $F_o-F_k$; and
- a divide-by-N frequency divider synchronized by $F_{oL}$, receiving said signal of frequency $F_n$, and delivering said recovered clock $F_{rec}$ to said second divide-by-M frequency divider.

Advantageously, a divide-by-T frequency divider is inserted between the mixer and the divide-by-N frequency divider.

Preferably, the phase comparator is constituted by an EXCLUSIVE-OR gate.

Other characteristics and advantages of the invention appear on reading the following description of a preferred embodiment, given as a non-limiting illustration, and from the sole accompanying figure which is a block diagram of the phase-locked loop of the invention.

BRIEF DESCRIPTION OF THE DRAWINGS

The sole FIGURE is a block diagram of the phase-locked loop of the invention.

DETAILED DESCRIPTION OF THE INVENTION

The phase-locked loop of the invention, given overall reference 10, receives a reference clock signal of frequency $F_{ref}$ in which some transitions are missing. This clock can be referred to as a "clock with holes". The loop 10 delivers a clock signal $F_{rec}$ referred to as the "recovered clock", based on the reference clock $F_{ref}$ and on a signal from a local oscillator of frequency $F_{oL}$. By way of example, the frequency $F_{oL}$ is at least eight times greater than the recovered clock frequency $F_{rec}$, so as to satisfy the G823 standard at 8 Mbit/s. The value of the ratio $F_{oL}/F_{rec}$ depends essentially on the performance desired for jitter measured on the recovered clock. The size of the buffer memory (e.g. constituted by a first-in/first-out (FIFO) memory) depends essentially on the jitter in the reference clock caused by the demultiplexing holes, and thus essentially on the frame structure used.

The clock with holes of frequency $F_{ref}$ is applied to a first divide-by-M frequency divider referenced 11 and delivering a signal of frequency $F_{ref}/M$. Similarly, the recovered clock of frequency $F_{rec}$ and delivered by a divide-by-N frequency divider 18 is applied to a second divide-by-M frequency divider referenced 12 and delivering a signal of frequency $F_{rec}/M$. The signals of frequencies $F_{ref}/M$ and $F_{rec}/M$ are applied to a phase comparator 13 having two inputs and constituted in this case by an EXCLUSIVE-OR gate, or in another embodiment by a D-type bistable. In the description below, consideration is given only to embodying the phase comparator in the form of an EXCLUSIVE-OR gate.

Phase comparison is thus performed between the reference clock and the recovered clock after division by M. This division serves to reduce jitter at the input to the loop, where jitter is caused by the holes in the reference clock: the high frequency jitter is filtered and the size of the holes relative to the comparison period is reduced. It is important for the loop to remain locked so as to limit phase error to the synchronization range of the phase comparator and so as to remain within its mode of linear operation. Under such circumstances, the maximum peak-to-peak jitter of the comparison signal is 1 IU, where IU is the nominal duration between two consecutive meaningful instants in an isochronous signal. The maximum jitter of the reference clock divided by M is 0.5 IU when using an EXCLUSIVE-OR gate as the phase comparator.

It is advantageous to use a phase comparator constituted by an EXCLUSIVE-OR gate since this type of comparator is adapted to signals having a duty ratio of 1/2 (which applies to clock signals divided by M), it has gain $K_d$ equal to $1/\pi$, and it is simple to implement in the form of an ASIC.

To read the buffer memory, all of the bits to the right of the most significant bit are used if the phase comparator is an EXCLUSIVE-OR gate: in this way, the most significant weights of read and write addresses are in phase opposition. The size of the buffer memory is thus tied to M since, when the loop is synchronized, the output from the phase comparator has a duty ratio of 1/2.

The phase error signal from the comparator 13 constitutes a control signal applied to a divide-by-K frequency divider referenced 14. The mean value of the signal output by the phase comparator is proportional to the phase error. The frequency divider 14 also receives a signal from the local oscillator of frequency $F_{oL}$, and it delivers a signal of frequency $F_k$.

The frequency $F_k$ lies in the range 0 Hz to $F_{oL}/K$. Thus, when the loop is locked at the center frequency $f_c$ (frequency equal to the rate of the clock to be recovered), the signal controlling the counter K contains as many 1s as 0s, and thus $F_k = F_{oL}/2K$. The minimum recovered frequency then corresponds to $F_k = F_{kmin} = 0$ Hz, and the maximum recovered frequency correspond to $F_k = F_{kmax} = F_{oL}/K$. In order to enable the loop to remain synchronized, it is necessary for the frequency $F_k$ used for resetting $F_{rec}$ on $F_{ref}$ to lie in the range $F_{kmin}$ and $F_{kmax}$, and for the jitter of $F_K$ caused by the holes in the reference clock to avoid causing $F_k$ to go beyond said limits.

The smaller the value of K, the greater the capture range of the loop. In contrast, the greater the value of K, the finer the adjustment of $F_{rec}$. It is therefore necessary to find a compromise. In practice, it is necessary to ensure that the capture range is considerably greater than ±30 ppm or ±50 ppm, depending on the data rate, and taking the accuracy of $F_{oL}$ into account. Also, at limit values it is necessary for the proportions of logic states 0 and 1 in the control signal to be as close as possible to 50% so as to provide a duty ratio of 1/2. In this way, the acceptable width of holes in the reference clock $F_{ref}$ is increased correspondingly.

The reference signal $F_k$ from the divider 14 is applied to a mixer 15 that also receives a signal of fixed frequency $F_o$ from an adder-counter 16 having the signal of frequency $F_{OL}$ applied to the input thereof. The mixer 15 delivers an output signal of frequency $F_o - F_k$.

The adder-counter 16 delivers the signal of frequency $F_o$ equal to $F_{OL}*p/q$ where p/q is the division ratio of the adder-counter 16.

The signal of frequency $F_o - F_k$ from the mixer 15 is optionally applied to a divide-by-T frequency divider referenced 17 that is optional and serves a function that is explained below.

The signal from the mixer 15 (or the signal from the divide-by-T divider 17) is applied to a divide-by-N frequency divider referenced 18. The input signal to this divider 18 is written $F_n$ and it corresponds either to $F_o - F_k$, or else to $(F_o - F_k)/T$. The divider 18 is synchronized by $F_{OL}$ and it delivers the recovered clock of frequency $F_{rec}$ to the second divide-by-M frequency divider referenced 12.

The divide-by-N divider 18 is synchronized by $F_{OL}$ (i.e. counting is performed by $F_{OL}$ and is interrupted at the frequency $F_n$).

The divide-by-T divider referenced 17 operates with T=2 or T=4. This divider is included to reduce the amplitude of residual jitter.

Variations of $F_o$ can be reduced by selecting a small value for p. In addition, the largest variations in $F_n$ are caused by the interruptions at the frequency $F_k$: at the mean frequency $F_k$, a front of the clock $F_o$ is eliminated, with its period thus being instantaneously doubled. The divide-by-T circuit divides the amplitude of this jitter by T.

There follows a theoretical study of the loop of the invention.

As mentioned above, the mean value of the output signal from the phase comparator 13, written $\overline{Ud}$, is proportional to the phase error:

$$\overline{Ud} = K_d * \phi_e$$

The frequency of the output signal from the divider 14 is thus written:

$$F_k = \overline{Ud} * \frac{F_{OL}}{K}$$

Also:

$$F_0 = F_{OL} * \frac{p}{q}$$

and $$F_n = \frac{1}{T}(F_0 - F_k)$$

The recovered frequency can thus be written:

$$F_{rec} = \frac{1}{N}\left[F_{OL} - \frac{1}{T}\left(F_{OL} * \frac{p}{q} - F_k\right)\right]$$

At the input to the phase comparator, $f_1 = F_{ref}/M$ and $f_2 = F_{rec}/M \cdot \Phi_e = f_1 - f_2$, whence:

$$\frac{d\phi_{rec}}{dt} = 2\pi * F_{rec} = \frac{2\pi}{N}\left[F_{OL} - \frac{1}{T}\left(F_{OL} * \frac{p}{q} - \frac{F_{OL} * Kd * (f_{ref} - f_{rec})}{K * M}\right)\right]$$

Passing to the complex plane gives:

$$j\omega\phi_{rec} = K_{tot} * (\phi_{rec} - \phi_{ref}) \text{ with } K_{tot} = \frac{2\pi * F_{OL} * KD}{T * N * K * M}$$

Whence:

$$G(j\omega) = \frac{\phi_{rec}(j\omega)}{\phi_{ref}(j\omega)} = \frac{K_{tot}}{j\omega + K(j\omega)}$$

The cutoff frequency of the system is thus equal to:

$$F_{3dB} = \frac{K_{tot}}{2\pi} = \frac{F_{OL} * Kd}{T * N * K * M} = \frac{F_{OL}}{\pi \cdot T \cdot N \cdot K \cdot M}$$

The loop capture range can be written:

$$F_{rec} = \frac{1}{N}\left[F_{OL} - \frac{1}{T}\left(F_{OL} * \frac{p}{q} - \frac{F_{OL} * Kd * (f_{ref} - f_{ref})}{K * M}\right)\right]$$

With $$0 \leq \overline{ud} = \frac{Kd * (\phi_{rec} - \phi_{ref})}{M} \leq 1$$

Whence:

$$F_{rec\_max} = \frac{F_{OL}}{N} \cdot \left[1 - \frac{p}{q \cdot T} + \frac{1}{T \cdot K}\right]$$

and $$F_{rec\_min} = \frac{F_{OL}}{N} \cdot \left[1 - \frac{p}{q \cdot T}\right]$$

The theoretical capture range is defined by:

$$\Delta F\_max = F_{rec\_max} - F_{rec\_min} = \frac{F_{OL}}{N \cdot T \cdot K}$$

The center frequency of the loop is:

$$F_c = \frac{F_{OL}}{N} \cdot \left[1 - \frac{p}{q \cdot T} + \frac{1}{2T \cdot K}\right] \quad (1)$$

with $F_c$ being capable of varying in the range $$F_c - \frac{\Delta F\_max}{2}$$

to $$F_c + \frac{\Delta F\_max}{2}$$

The theoretical capture range of the loop is independent of the type of comparator so long as the input phase error lies within its synchronization range.

When the reference clock suffers from holes, the real capture range is smaller: the loop loses synchronization when the reference frequency goes outside the capture range or when it is subjected to variations that are too fast relative to the response time of the system.

In order to increase the capture range in the presence of holes, it is possible to increase the number by which the divide-by-M circuit divides. This reduces the jitter in the phase comparator signal, reduces the cutoff frequency of the loop, and increases its response time. The system can then filter jitter in the reference clock better, however capture time is longer. It is therefore advantageous to select M to be as small as possible, particularly since the size of the buffer memory depends on M.

When the reference frequency $F_{ref}$ is not equal to its nominal value, the comparison signal at equilibrium has 1s and 0s in different proportions. The system then accepts less jitter on the reference clock: for example, if the equilibrium position corresponds to 60% of logic 1 states and to 40% of logic 0 states, then the maximum jitter of the comparison signal becomes 2*0.4=0.8 IU peak to peak, instead of 1 IU. The greater the capture range, the closer together the proportions of logic states 1 and 0 at limit values for $F_{ref}$, and the closer the jitter acceptable on the phase comparison signal to 1 IU.

The value chosen for M therefore depends on the frame structure and on the response time of the system, i.e. on its transfer function. A compromise needs to be found since the response time of the system increases with M, thereby creating equilibrium that is less stable, while its cutoff frequency decreases, thus enabling disturbances in the reference clock to be filtered better. If the width of the holes in the reference clock is increased, then it is necessary to increase the capture range of the loop, and possibly also the value of M and the size of the buffer memory.

The jitter of the recovered clock stems essentially from variations in the division rank of the counter N. This can be quantified by studying variations in the interrupt frequency of the counter: $F_n$.

$$F_{n\_MIN} \leq F_n \leq F_{n\_MAX}$$

The value of N is selected as follows:

$$F_{OL}/N \geq F_c > F_{OL}/(N+1)$$

Thus, $F_n = F_{OL} - N*F_c < F_c$, and the counter N is interrupted either 1 or 0 times before period of the recovered clock.

The extreme values of $F_n$ are as follows:

$$F_{n\_MIN} = 0$$

$$F_{n\_MAX} = F_c$$

The period of the recovered clock is thus constituted by N or N+1 periods of $F_{OL}$. The amplitude of the residual jitter observed on the recovered clock is thus of the order of one period of $F_{OL}$, i.e. (1/N)IU peak to peak.

The output pitch is the minimum value for variation in frequency when the division ratio of the divide-by-K counter changes by unity. This output pitch is written P and is given by:

$$P = \frac{F_{OL}}{T \cdot N \cdot K \cdot (K+1)}$$

It will be observed that K must be large enough for a reasonable output pitch (several Hz). It is also preferable to have a large value for N.

Let $\tau$ be the percentage of logic "1" states in the signal coming from the phase comparator 13. The value of $\tau$ is given by:

$$\tau = K \cdot T \cdot \left[ \frac{N \cdot F_c}{F_{OL}} - 1 + \frac{p}{q \cdot T} \right]$$

The minimum value of $\tau$ (written $\tau_{min}$) is obtained for $F_{OL\_max}$ and for $\tau_{max}$, and is equal to $1 - \tau_{min}$.

The loop described above is applicable not only to all three data rates mentioned, but also to other data rates, particularly when the jitter in the recovered clock is large.

More precisely, the center frequency of the loop is entirely programmable because of:

the selected value for N which enables Fc to be approximated in application of the following relationship:

$$F_{OL}/(N+1) \leq F_c \leq F_{OL}/N$$

the selected adder-counter (and value for T) making it possible to approximate the frequency $F_c$ more finely, with the frequency $F_c$ being slightly greater than:

$$\frac{F_{OL}}{N}\left(1 - \frac{p}{q \cdot T}\right)$$

the contribution of $F_k$ is larger or smaller depending on phase error, being smaller in value than the recovered clock (by about 50 kHz to 100 kHz). The larger the frequency $F_k$ (K, small), the larger the capture range of the loop. In contrast, the recovered clock becomes more sensitive to variations in phase error: the cutoff frequency of the loop increases with decreasing K.

The values of the parameters depend initially on the ratio $F_{OL}/F_{rec}$: starting from the value 1, this ratio gives an integer value for N on the basis of which the smallest possible value of $F_n$ is determined. Given $F_n$, the values of K, T, and p/q are determined, observing that the greater the frequency $F_k$, the greater the capture range, but also the greater the jitter.

A digital application of the invention is given in the table in the appendix. The three above-mentioned transmission rates are considered (1.544 Mbit/s, 2.048 Mbit/s, and 8.448 Mbit/s), and thus to three different clock frequencies that are to be recovered with appropriate selections for M, K, p, q, N, and optionally T, using a phase comparator constituted by an EXCLUSIVE-OR gate. The value of $F_{OL}$ is 68.736 MHz.

In the table, the depth of the buffer memory is 16 bits (M=32) for rates of 1.544 MHz and 2.048 MHz, and 3 bits (M=64) for a data rate of 8.448 MHz. The depth of the adder-counter is 11 bits. The value chosen for M depends on the frame structure, as described above.

In the context of a specific application, the largest hole in the reference clock is caused by a 12-bit frame-locking word, the framed rate is 9.874 MHz and the frequency of the clock to be recovered is 8.448 MHz. In this particular case the maximum jitter of the clock with holes is (12/9.874) *8.448≈10 IU peak to peak relative to the clock frequency recovered at 8.448 MHz. The jitter caused by the hole in the phase comparator signal is about 10/M, i.e. about 0.31 IU for M=32 and 0.16 IU for M=64. It is therefore necessary to select $\tau_{min} > 0.31$ for M=32 and $\tau_{min} > 0.16$ for M=64.

Tests have verified that the loop of the invention operates properly when the reference frequency varies by ±30 ppm about its nominal value, at the data rate 8.448 Mbit/s, and by ±50 ppm for the other rates. The loop remains synchronized at these frequencies. It also operates with a local oscillator of accuracy ±50 ppm. The measured capture range is less than the theoretical range, because of the holes in the reference clock.

The phase-locked loop of the invention is suitable, in particular, for ASIC implementation.

APPENDIX

|  | $F_c$ = 1.544 MHz | $F_c$ = 2.048 MHz | $F_c$ = 8.448 MHz |
|---|---|---|---|
| M | 32 | 32 | 64 |
| K | 771 | 757 | 601 |
| p | 49 | 70 | 139 |
| q | 2048 | 2048 | 2048 |
| T | 2 | 2 | 4 |
| N | 44 | 33 | 8 |
| $F_0$(MHz) | 1.645 | 2.349 | 4.666 |
| $F_k$(kHz) | 45.5 | 45.4 | 57.2 |
| $F_n$(MHz) | 0.8 | 1.152 | 1.152 |
| $F_{3dB}$(HZ) | 10.1 | 13.7 | 17.8 |
| $F_{rec\_min}$ (MHz) | 1.543 | 2.047 | 8.446 |
| $F_{rec-max}$ (MHZ) | 1.545 | 2.049 | 8.449 |
| P (Hz) | 1.3 | 1.8 | 5.9 |
| $\tau_{min}$ | 0.5 | 0.5 | 0.5 |

We claim:

1. A digital phase-locked loop of the type delivering a recovered clock signal $F_{rec}$, from a reference clock signal $F_{ref}$ in which some transitions are missing, the loop comprising:

a first divide-by-M frequency divider (11) receiving said reference clock signal $F_{ref}$ and delivering a signal of frequency $F_{ref}/M$;

a two-input phase comparator (13), one input receiving said signal of frequency $F_{ref}/M$, and another input receiving the output signal from a second divide-by-M frequency divider (12), said phase comparator (13) delivering a phase error signal;

a divide-by-K frequency divider (14) for dividing a local oscillator signal of frequency $F_{oL}$, the divider receiving said phase error signal as its control signal and delivering a signal of frequency $F_k$;

an adder-counter (16) receiving said local oscillator signal of frequency $F_{oL}$ and delivering an output signal of frequency $F_o$ equal to $F_{OL}*p/q$ where p/q is the division ratio of said adder-counter (16);

a mixer (15) receiving said signal of frequency $F_k$ and said signal of frequency $F_o$, said mixer (15) delivering a signal of frequency $F_n$ equal to $F_O - F_k$; and a divide-by-N frequency divider (18) synchronized by $F_{oL}$, receiving said signal of frequency $F_n$, and delivering said recovered clock signal $F_{rec}$ to said second divide-by-M frequency divider.

2. A phase-locked loop according to claim 1, wherein the loop further comprises a divide-by-T frequency divider (17) inserted between said mixer (15) and said divide-by-N frequency divider (18).

3. A phase-locked loop according to claim 1, wherein said two input phase comparator is constituted by an EXCLUSIVE-OR gate (13).

* * * * *